(12) United States Patent
Shiah (10) Patent No.: US 11,646,066 B2
(45) Date of Patent: May 9, 2023

(54) MEMORY CONTROLLER AND RELATED MEMORY

(71) Applicant: Etron Technology, Inc., Hsinchu (TW)

(72) Inventor: Chun Shiah, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 17/100,955

(22) Filed: Nov. 23, 2020

(65) Prior Publication Data

US 2021/0183415 A1  Jun. 17, 2021

Related U.S. Application Data

(60) Provisional application No. 62/954,646, filed on Dec. 29, 2019, provisional application No. 62/948,771, filed on Dec. 16, 2019.

(51) Int. Cl.
*G11C 7/10* (2006.01)
*G11C 7/22* (2006.01)

(52) U.S. Cl.
CPC ............ *G11C 7/1048* (2013.01); *G11C 7/106* (2013.01); *G11C 7/1039* (2013.01); *G11C 7/1087* (2013.01); *G11C 7/222* (2013.01)

(58) Field of Classification Search
CPC .................... G11C 7/1048; G11C 7/10

USPC ......................................... 365/203
See application file for complete search history.

(56) References Cited

U.S. PATENT DOCUMENTS

| | | | | |
|---|---|---|---|---|
| 2003/0088753 A1* | 5/2003 | Ikeda | ............... | G11C 11/4076 711/202 |
| 2010/0306460 A1* | 12/2010 | Hara | ............... | G06F 12/04 710/52 |
| 2013/0080826 A1* | 3/2013 | Kondo | ............... | G11C 29/824 714/E11.085 |
| 2013/0265840 A1* | 10/2013 | Yoshimura | ............ | G11C 5/063 365/226 |
| 2015/0063015 A1* | 3/2015 | Shimizu | ............ | G11C 11/1653 365/158 |
| 2016/0148654 A1* | 5/2016 | Sohn | ............... | G11C 7/109 365/189.011 |
| 2019/0369913 A1* | 12/2019 | Hahn | ............... | G06F 3/0619 |

* cited by examiner

*Primary Examiner* — Muna A Techane
(74) *Attorney, Agent, or Firm* — Winston Hsu (57) ABSTRACT

A memory controller includes a command processor. When an access command is performed by the memory controller, the command processor generates a row address information to the memory before issuing an active command to the memory. The row address information and the active command are issued by the command processor based on the access command.

22 Claims, 11 Drawing Sheets

FIG. 1 PRIOR ART

| | |
|---|---|
| Rd or Wr Dram BL8 | C0 |
| Rd or Wr Dram BL8 | C1 |
| Rd or Wr Dram BL8 | C2 |
| Rd or Wr Dram BL8 | C3 |
| Queue 4···15 | C4···15 |

MEMORY CONTROLLER AND RELATED MEMORY

CROSS REFERENCE TO RELATED APPLICATIONS

This application claims the benefit of U.S. Provisional Application No. 62/948,771, filed on Dec. 16, 2019 and entitled "Better DRAM System with Pre Row address command", and the benefit of U.S. Provisional Application No. 62/954,646, filed on Dec. 29, 2019 and entitled "Memory System with Pre Row Address Command," the contents of which are incorporated herein by reference.

BACKGROUND OF THE INVENTION

1. Field of the Invention

The present invention relates to a memory controller and a memory system, and particularly to a memory controller and a memory system that can reduce a time interval between a memory receiving an active command and turning on a corresponding word line.

2. Description of the Prior Art

Figure 1:
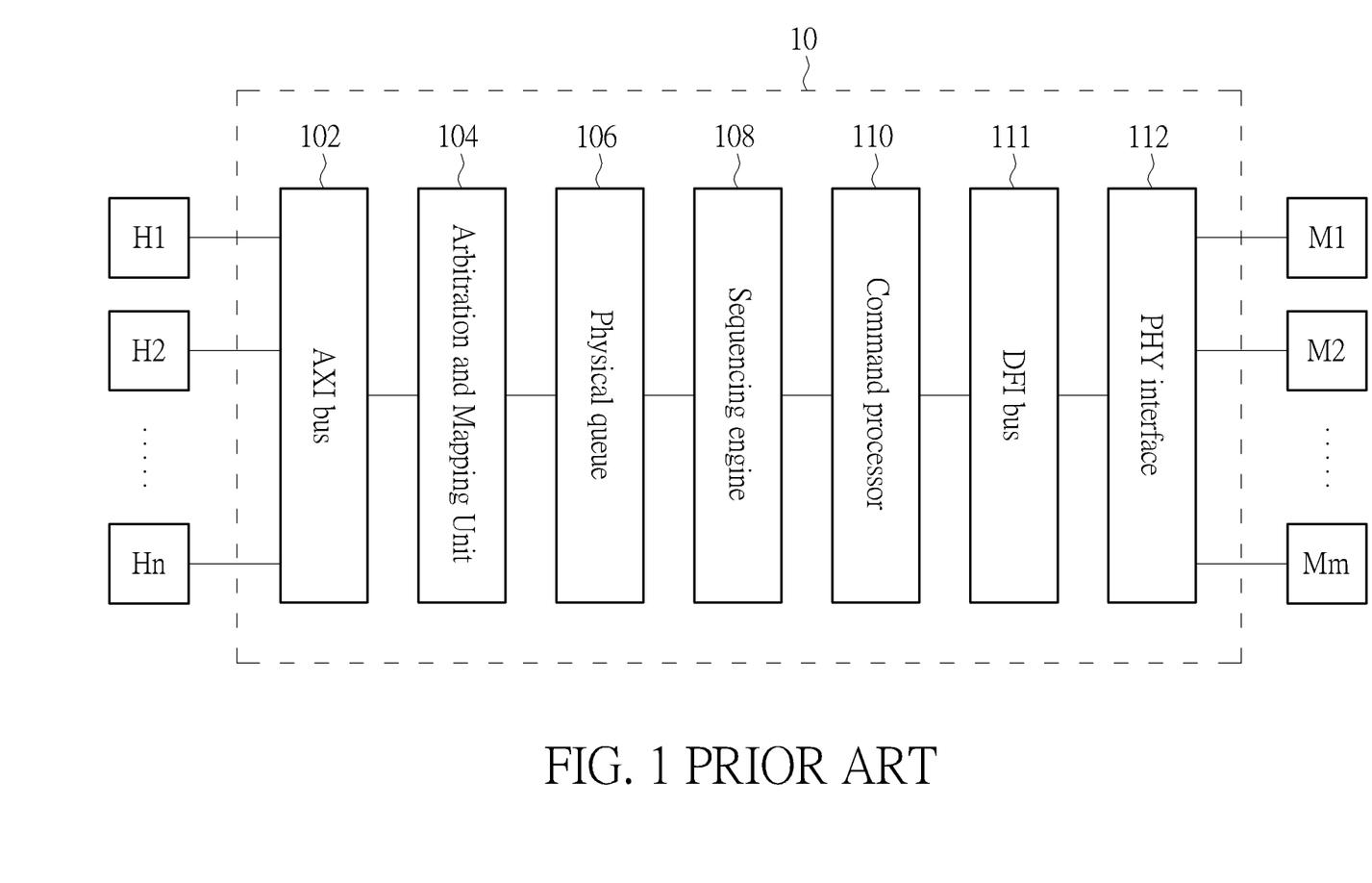
FIG. 1 is a diagram illustrating a memory controller according to the prior art.

Please refer to FIG. 1. FIG. 1 is a diagram illustrating a dynamic random access memory (DRAM) controller 10 according to the prior art. As shown in FIG. 1, one hand of the DRAM controller 10 can be coupled to a plurality of hosts H1-Hn through an advanced extensible interface (AXI) bus 102 of the DRAM controller 10, and the other hand of the DRAM controller 10 can be coupled to a plurality of memories M1-Mm through a port physical layer (PHY) interface 112 of the DRAM controller 10, wherein the plurality of memories can be double data rate (DDR~DDR4 or higher) memories, low power DDR (LPDDR~LPDDR4 or higher), etc.

Figure 2:
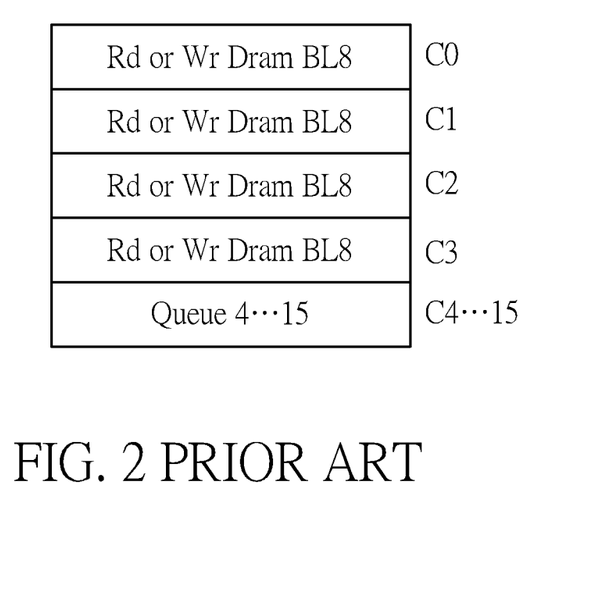
FIG. 2 is a diagram illustrating the command queue.
Figure 3:
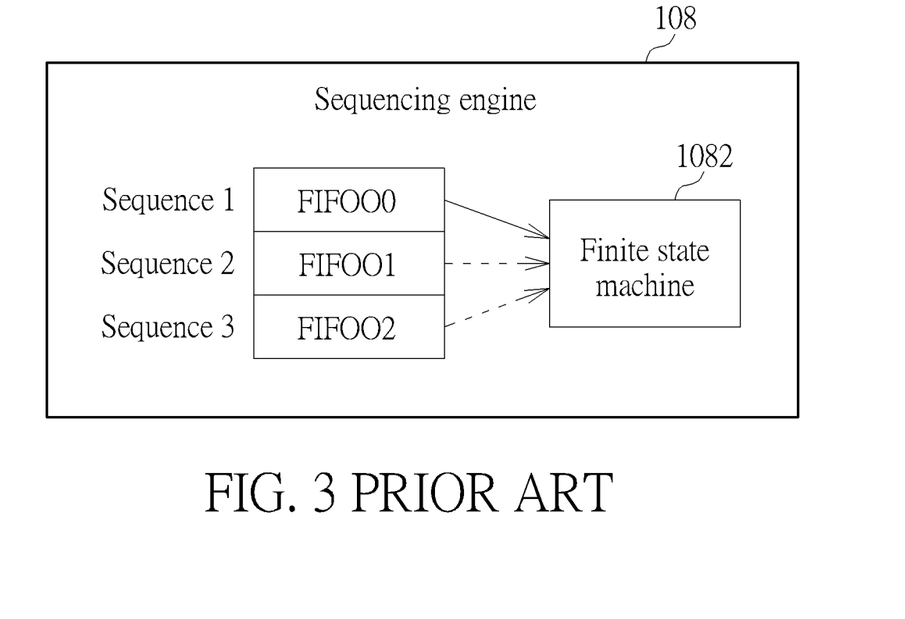
FIG. 3 is a diagram illustrating the sequencing engine.
Figure 4:
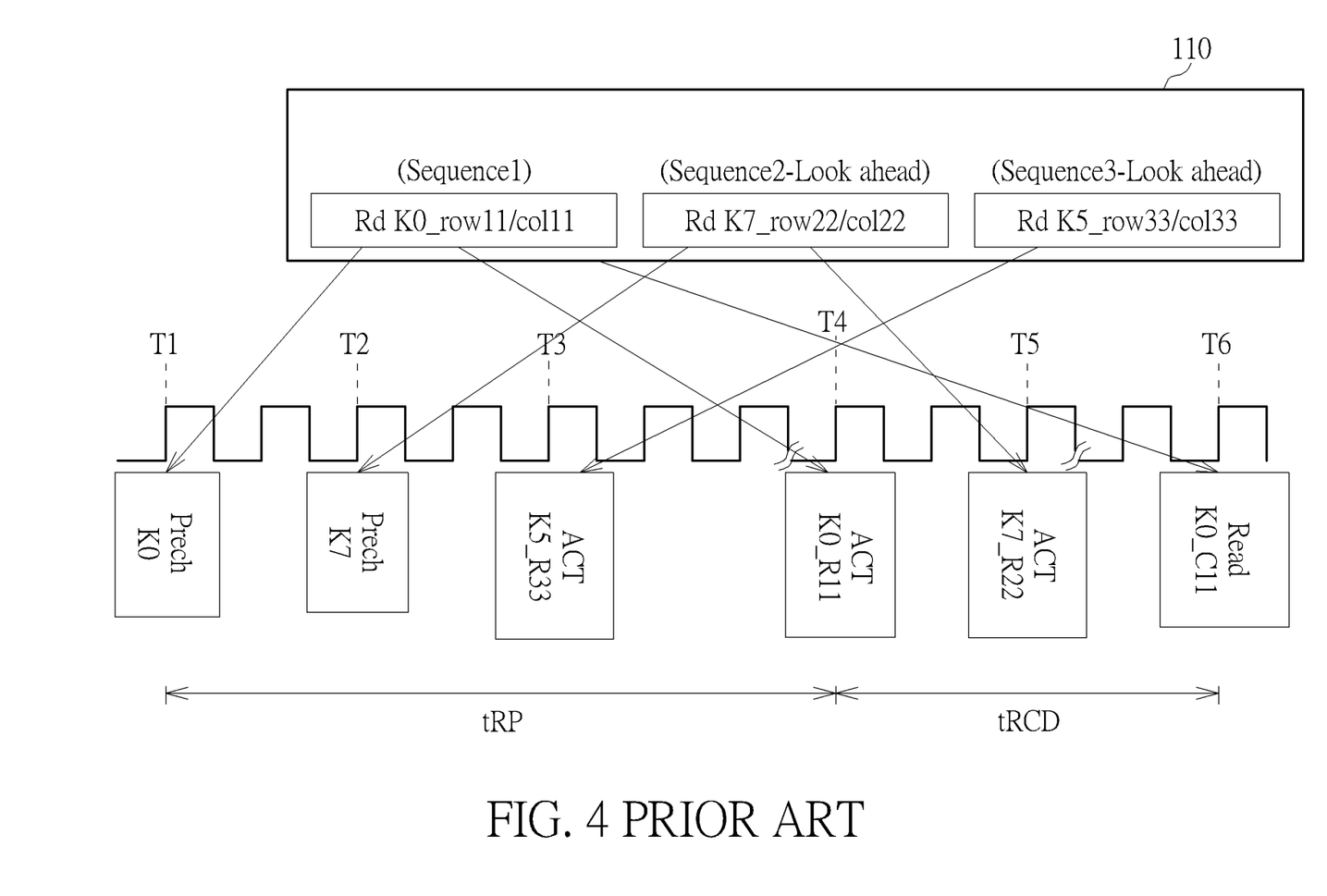
FIG. 4 is a diagram illustrating the operational timing of the command processor of the memory controller according to the prior art.

As shown in FIG. 1, the DRAM controller 10 further includes an arbitration and mapping unit 104, a physical queue 106, a sequence engine 108, a command processor 110, and a double data rate (DDR) PHY interface (DFI) bus 111. The arbitration and mapping unit (or abbreviated as "the arbitration unit") 104 can decide priority of access commands (or commands) generated from the plurality of hosts H1-Hn and mapped from AXI address into memory address. After the priority of the commands is determined, the physical queue 106 can store the commands as a command queue 202 (shown in FIG. 2) according to the priority with mapped address. For example, there are 16 physical queues with 16 commands (C0 to C15), each queue has 36 bits including command bits, bank address, row address and column address. The stored access command or command may correspond to a Read (Rd) or a Write (Wr) command for 8-bits length from the DRAM memory. Then, the physical queue 106 can sequentially transmit the commands C0-C15 to the sequencing engine 108. For example, the physical queue 106 can sequentially transmit the commands C0-C2 to registers FIFOO0-FIFOO2 (shown in FIG. 3) of the sequencing engine 108, that is, the commands C0-C2 are sequentially stored in the registers FIFOO0-FIFOO2, respectively. In addition, as shown in FIG. 3, a finite state machine 1082 included in the sequencing engine 108 executes the commands C0-C2 stored in the registers FIFOO0-FIFOO2 according to a sequence corresponding to the registers FIFOO0-FIFOO2. For example, the finite state machine 1082 first executes the command C0 (having sequence 1) stored in the register FIFOO0, and then sequentially executes the command C1 (having sequence 2) stored in the register FIFOO1 and the command C2 (having sequence 3) stored in the register FIFOO2. The command processor 110 also processes the command C0, and sequentially processes the command C1 and the command C2, wherein an operational timing of the command processor 110 processing the command C0, the command C1, and the command C2 can be referred to FIG. 4. As shown in FIG. 4, in this example, the command C0 could correspond to a READ command (or a write command) with a column address 11 and a row address 11 of a bank 0, the command C1 could correspond to a READ command (or a write command) with a column address 22 and a row address 22 of a bank 7, the command C2 could correspond to a READ command (or a write command) with a column address 33 and a row address 33 of a bank 5.

When the finite state machine 1082 executes the command C0, the finite state machine 1082 can first check if the row address 11 of the bank 0 is activated. If the row address 11 of the bank 0 is inactivated and another row of the bank 0 is activated. If the row 11 of the bank 0 is inactivated and another row of the bank 0 is activated, the finite state machine 1082 enters a pre-charge state and controls the command processor 110 to generate a pre-charge command PRECH_K0 (at a time T1 shown in FIG. 4). As shown in FIG. 4, after a time period tRP (defined in JEDEC double data rate memory specification) following the command processor 110 generates the pre-charge command PRECH_K0, the command processor 110 can execute the active command ACT_K0_R11 to select the Row address 11 of the bank 0 (at a time T4 shown in FIG. 4). The address of Row address 11 accompanying the active command ACT_K0_R11 will also be received by the memory at the same time After a time period tRCD (defined in JEDEC double data rate memory specification) following the command processor 110 generates the active command ACT_K0_R11, can execute the read command RD_K0_C11 to select the column address 11 of the bank 0 (at a time T6 shown in FIG. 4). The address of column address 11 accompanying the read (or write) command RD_K0_C11 will also be received by the memory at the same time. After the memory M1 receives the read (or write) command RD_K0_C11, a datum stored in a memory cell coupled to the row address 11 and the column address 11 of the bank 0 of the memory M1 will be read (or data will be written into the row address 11 and the column address 11 of the bank 0 of the memory M1).

During the period tRP and period tRCD, the command processor 110 could process portion of the command C1 and/or command C2 based on some look ahead rules. For example, before the active command ACT_K0_R11 corresponding to command C0 is generated, the finite state machine 1082 could controls the command processor 110 to generate a pre-charge command PRECH_K7 corresponding to command C1 (at a time T2 shown in FIG. 4) and later generate an active command ACT_K5_R33 corresponding to command C2 (at a time T3 shown in FIG. 4). Furthermore, during the period of tRCD, the finite state machine 1082 could controls the command processor 110 to generate an active command ACT_K7_R22 corresponding to command C1 (at a time T5 shown in FIG. 4). To be mentioned, unlike the command C0 and C1, there is no pre-charge command corresponding to command C2 issued by the command processor 110 during T1-T3 in this case, because the bank 5 to be read (or written) according command C2 may be already pre-charged (or be executed by an auto-refresh command, or a pre-charge all command) before T1.

Figure 5:
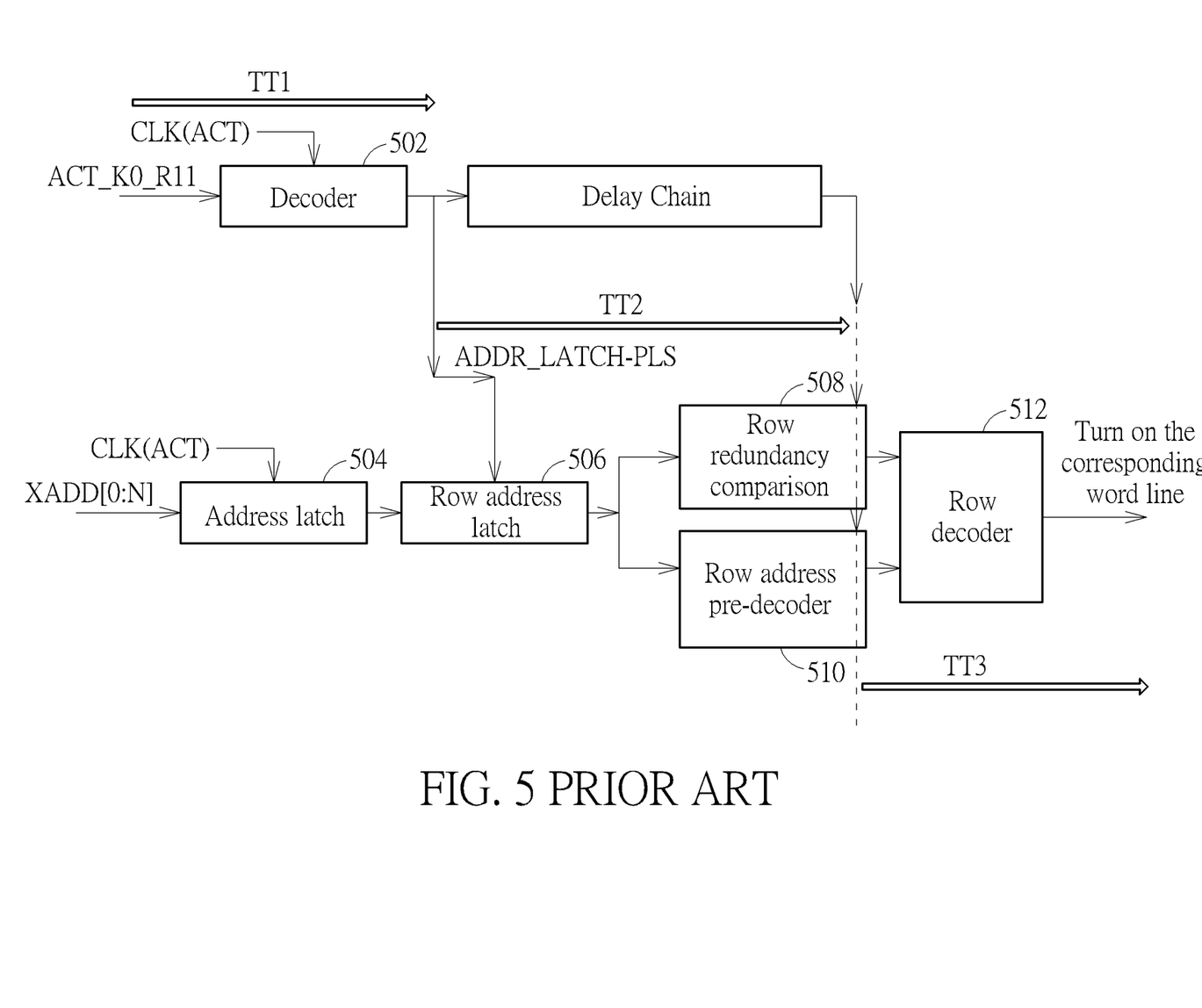
FIG. 5 is a diagram illustrating operation of the memory after the memory receives the active command.

As shown in FIG. 5, taking the command C0 as an example, after the memory M1 receives the active command ACT_K0_R11, a time interval TT1 is for a decoder 502 of the memory M1 receiving and decoding the active command ACT_K0_R11. Thereafter, a time interval TT2 is for the row address latch 506 latching/outputting the address of the row and for a row redundancy comparison 508 and a row address pre-decoder 510 being ready according to the address of the row address 11. Then, a time interval TT3 is for a row decoder 512 decoding a corresponding word line according to the address of the row address 11.

However, as shown in FIG. 4, in the command processor 110 the command C0 already includes address information of the column address 11 and the row address 11 of the bank 0, the command C1 also includes address information of the column address 22 and the row address 22 of the bank 7, and the command C2 includes address information of the column address 33 and the row address 33 of the bank 5 as well. In addition, as shown in FIG. 4, because unoccupied time still exists between the pre-charge command PRECH_K0 and the active command ACT_K0_R11 of the command C0, how to utilize the unoccupied time to delete the time interval TT2 (the delay chain) has become an important issue for a designer of the DRAM controller 10.

SUMMARY OF THE INVENTION

The present invention provides a memory controller and a memory thereof. The memory controller can generate a pre-row address command to the memory between issuing a pre-charge command and issuing an active command, so that compared to the prior art, the memory can utilize the pre-row address command to rapidly turn on a corresponding word line.

An embodiment of the present invention provides a memory controller for a memory. The memory controller includes a command processor. When an access command is performed by the memory controller, the command processor generates a row address information to the memory before issuing an active command to the memory, wherein the row address information and the active command are issued by the command processor based on the access command.

According to another aspect of the invention, the command processor further issues a pre-charge command to the memory, and the row address information is generated at a clock falling edge or a clock rising edge right after the pre-charge command.

According to another aspect of the invention, the command processor further issues a pre-row address command to a memory to latch the row address information before the memory receives the active command, and the pre-row address command is issued by the command processor based on the access command.

According to another aspect of the invention, the row address information and the pre-row address command are generated to the memory within a clock period, or simultaneously generated to the memory.

According to another aspect of the invention, after issuing the active command, the command processor generates a read or write command based on the access command, and the command processor further generates a column address information between issuing the active command and issuing the read or write command.

According to another aspect of the invention, the command processor further issues a pre-column address command to a memory to latch the column address information before the memory receives the read or write command, and the pre-column address command is issued by the command processor based on the access command.

According to another aspect of the invention, the column address information and the pre-column address command are generated to the memory within a clock period, or simultaneously generated to the memory.

According to another aspect of the invention, the memory controller includes a sequencing engine, wherein the sequencing engine is coupled to the command processor, the access command is stored in the sequencing engine, and the sequencing engine controls the command processor to sequentially generate the row address information and the active command according to the access command.

According to another aspect of the invention, after issuing the active command, the sequencing engine controls the command processor to generate a column address information corresponding to the access command, and then generate a read or write command corresponding to the access command.

Another embodiment of the present invention provides a memory, wherein the memory is capable to receive an access command from a memory controller. The memory includes a first decoder. The first decoder is configured to decode an active command corresponding to the access command; wherein a row address information corresponding to the access command is received by the memory before the active command is received by the memory.

According to another aspect of the invention, the memory further includes a second decoder, wherein the second decoder is configured to decode a pre-charge command corresponding to the access command, and the row address information is received by the memory at a clock falling edge or a clock rising edge right after the pre-charge command is received by the memory.

According to another aspect of the invention, the memory further includes a third decoder, wherein the third decoder is configured to decode a pre-row address command corresponding to the access command, and the pre-row address command is configured to latch the row address information before the memory receives the active command.

According to another aspect of the invention, the row address information and the pre-row address command are received by the memory within a clock period, or simultaneously received by the memory.

According to another aspect of the invention, the memory further includes a row address latch, wherein the third decoder decodes the pre-row address command and generates a latch signal to the row address latch to latch the row address information before the memory receives the active command.

According to another aspect of the invention, the memory further includes a fourth decoder, wherein the fourth decoder is configured to decode a read or write command corresponding to the access command, and a column address information is received by the memory before the read or write command is received by the memory.

According to another aspect of the invention, the column address information and the pre-column address command are received by the memory within a clock period, or simultaneously received by the memory.

According to another aspect of the invention, the memory further includes a fifth decoder, wherein the fifth decoder is configured to decode a pre-column address command corresponding to the access command, and the pre-column address command is configured to latch the column address information before the memory receives the read or write command.

According to another aspect of the invention, the column address information and the pre-column address command are received by the memory within a clock period, or simultaneously received by the memory.

According to another aspect of the invention, the memory further includes a column address latch, wherein the fifth decoder decodes the pre-column address command and generates a latch signal to the column address latch to latch the column address information before the memory receives the read or write command.

Another embodiment of the present invention provides a memory system. The memory system includes a memory controller and a memory. The memory is coupled to the memory controller. When an access command is performed by the memory controller, the command processor generates a row address information to the memory before issuing an active command to the memory; wherein the row address information and the active command are issued by the command processor based on the access command.

According to another aspect of the invention, the command processor further issues a pre-row address command to the memory to latch the row address information before the memory receives the active command.

According to another aspect of the invention, the row address information and the pre-row address command are generated to the memory within a clock period, or simultaneously generated to the memory.

These and other objectives of the present invention will no doubt become obvious to those of ordinary skill in the art after reading the following detailed description of the preferred embodiment that is illustrated in the various figures and drawings.

DETAILED DESCRIPTION

Figure 6:
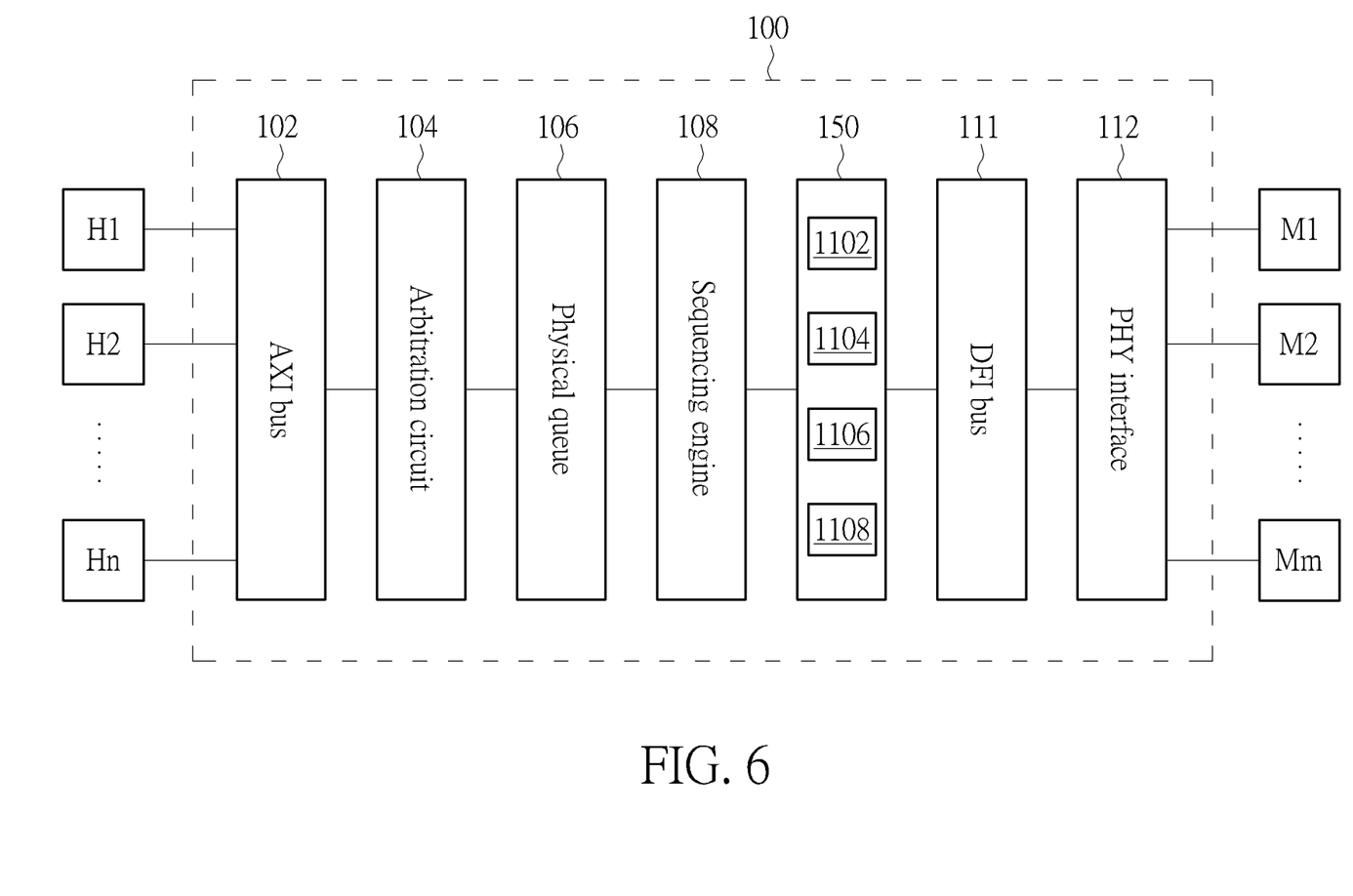
FIG. 6 is a diagram illustrating a memory controller according to an embodiment of the present invention.

Please refer to FIG. 6. FIG. 6 is a diagram illustrating a memory controller 100 according to an embodiment of the present invention. As shown in FIG. 6, the memory controller 100 at least includes an advanced extensible interface (AXI) bus 102, an arbitration circuit 104, a physical queue 106, a sequencing engine 108, a command processor 150, and a port physical layer (PHY) interface 112, wherein the AXI bus 102, the arbitration circuit 104, the physical queue 106, the sequencing engine 108, the DFI bus 111, and the PHY interface 112 shown in FIG. 6 are the same as those of the DRAM controller 10 shown in FIG. 1, so further description thereof is omitted for simplicity. In addition, a difference between the memory controller 100 and the DRAM controller 10 is that the command processor 150 in FIG. 6 is different from the command processor 110 in FIG. 1. In addition, coupling relationships between the AXI bus 102, the arbitration circuit 104, the physical queue 106, the sequencing engine 108, the command processor 150, the DFI bus 111, and the PHY interface 112 can be referred to FIG. 6, so further description thereof is also omitted for simplicity. In addition, other circuits included in the memory controller 100 except the above-mentioned elements are not the technical features which the present invention focuses on, so further description thereof is also omitted for simplicity.

Figure 7:
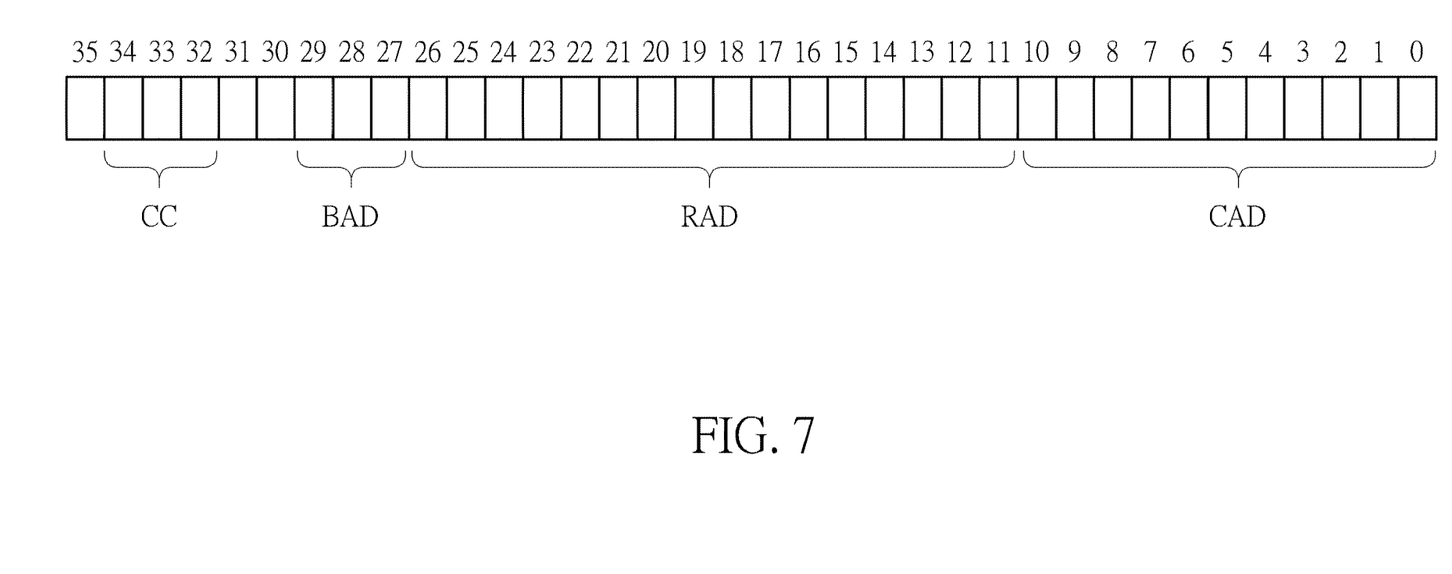
FIG. 7 is a diagram illustrating the data structure of the command.

In addition, a data structure of the command C0 in the registers (such as, FIFOO0-FIFOO2) of the sequencing engine 108 can be referred to FIG. 7. As shown in FIG. 7, the command C0 has 36 bits B0-B35, wherein the bits B0-B10 store column address data CAD, the bits B11-B26 store row address data RAD, the bits B27-B29 store bank address data BAD, the bits B32-B34 store a command code CC, and the bits B30, B31, B35 are reserved bits. For example, the column address data CAD For example, the column address data CAD represent a column address 11, the row address data RAD represent the row address 11, the bank address data BAD represent the bank 0 of the memory M1, and the command code CC represents READ command or WRITE command. In addition, a data structure of each of the commands C1, C2 is the same as one of the command C0, so further description thereof is omitted for simplicity. command processor 150 begins to execute the command C0, all addresses, including the row address data RAD and the column address data CAD, are already stored in the sequencing engine 108 and available to be transmitted to the command processor 150.

Figure 8:
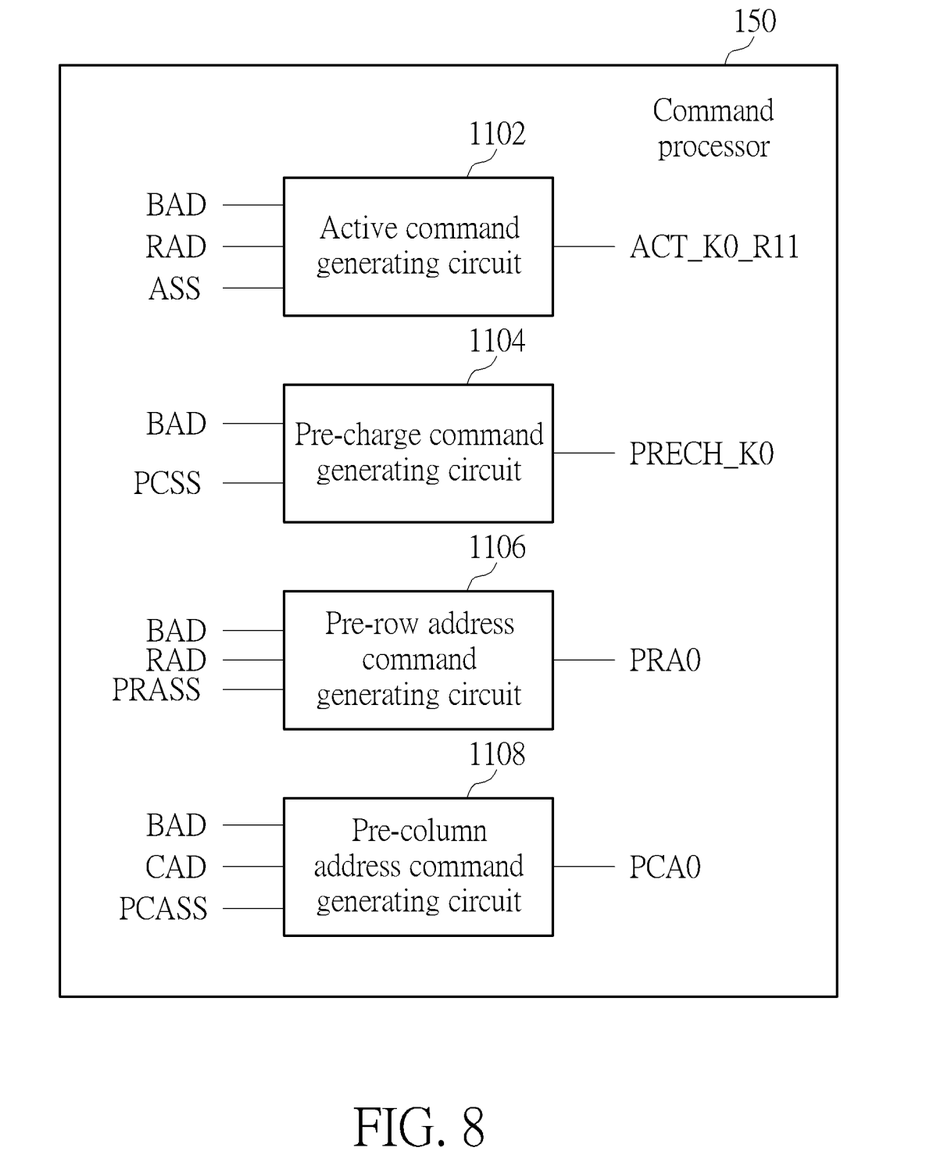
FIG. 8 is a diagram illustrating the command processor.

In addition, please refer to FIG. 8. FIG. 8 is a diagram illustrating operation of the command processor 150. As shown in FIG. 8, the command processor 150 includes an active command generating circuit 1102, a pre-charge command generating circuit 1104, a pre-row address command generating circuit 1106, and a pre-column address command generating circuit 1108. Now, taking the command C0 as an example, the active command generating circuit 1102 can generate an active command ACT_K0_R11 according to the bank address data BAD of the bank 0 of the memory M1, the row address data RAD of the bank 0, and an active sure signal ASS, wherein the bank address data BAD and the row address data RAD could be transmitted from the sequencing engine 108; the pre-charge command generating circuit 1104 can generate a pre-charge command PRECH_K0 according to the bank address data BAD and a pre-charge sure signal PCSS, wherein the bank address data BAD is transmitted from the sequencing engine 108; the pre-row address command generating circuit 1106 can generate a pre-row address command PRA0 according to the bank address data BAD, the row address data RAD, and a pre-row address sure signal PRASS, wherein the bank address data BAD, the row address data RAD could be transmitted from the sequencing engine 108; and the pre-column address command generating circuit 1108 can generate a pre-column address command PCA0 according to the bank address data BAD, the column address data CAD, and a pre-column address sure signal PCASS, wherein the bank address data BAD, the column address data CAD could be transmitted from the sequencing engine 108. In addition, the command processor 150 can transmit the pre-row address command PRA0, the pre-charge command PRECH_K0, the pre-column address command PCA0, and the active command ACT_K0_R11 to the memory M1 through a double data rate (DDR) PHY interface (DFI) bus 111 and the PHY interface 112, wherein as shown in FIG. 6, the DFI bus 111 is coupled between the command processor 150 and the PHY interface 112.

In one embodiment, the command C0 stored in the register FIFOO0 corresponds to sequence 1, the command C1 stored in the register FIFOO1 corresponds to sequence 2, and the command C2 stored in the register FIFOO2 corresponds to sequence 3. The finite state machine 1082 of the sequencing engine 108 can control the command processor 150 to execute the command C0, and meanwhile look ahead the command C1 and the command C2 to efficiently transmit available address information to command processor 150 to generate the pre-row address command PRA0 and/or the pre-column address command PCA0 at suitable time.

Figure 9:
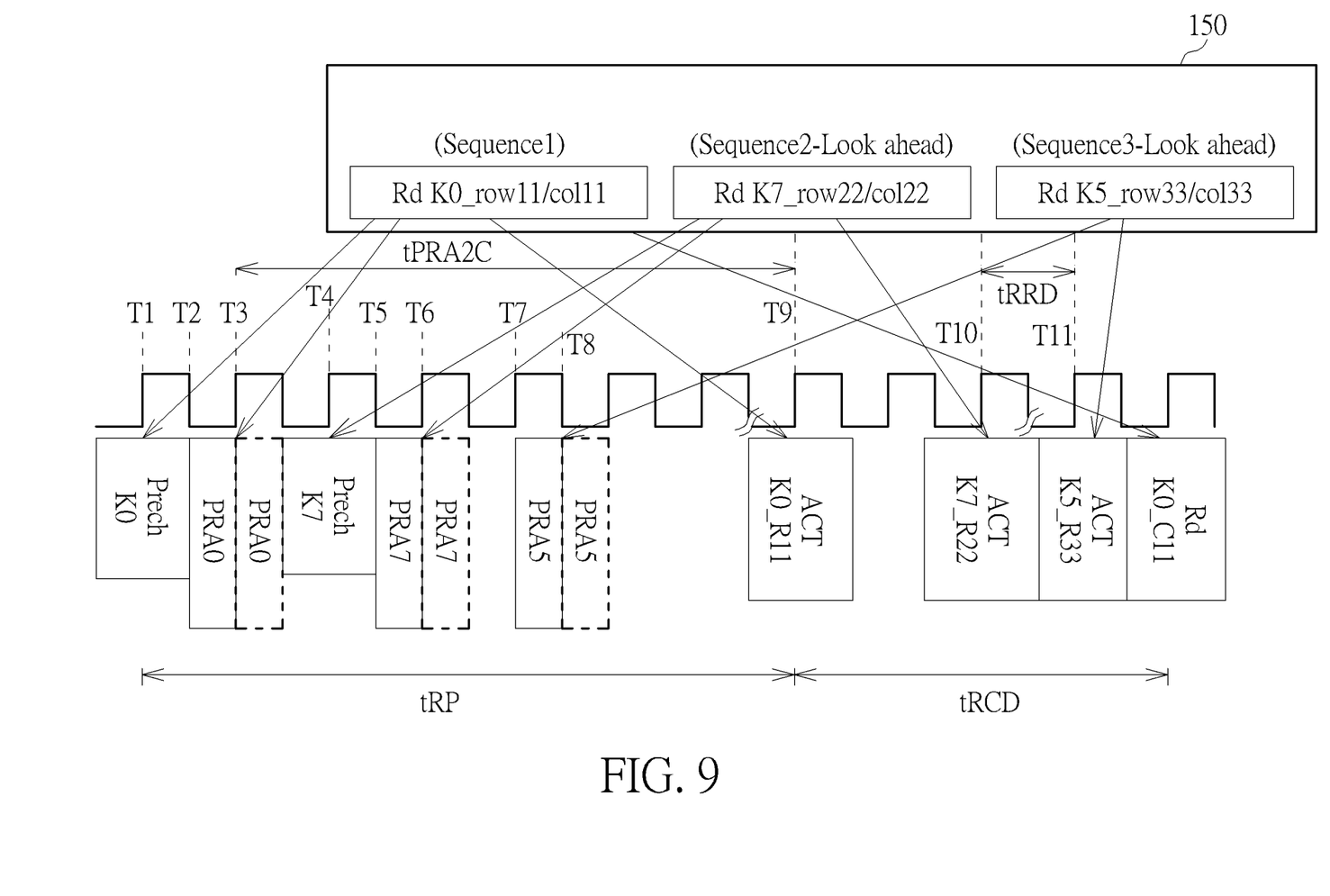
FIG. 9 is a diagram illustrating the operational timing of the command processor.

Each access command in this invention could be corresponding to a READ command or a WRITE command, and in the following only READ command will be discussed as example. As shown in FIG. 9, taking the command C0 corresponding to READ of column address 11 and row address 11 in the bank 0, the command C1 corresponding to READ of column address 22 and row address 22 of in the bank 7, the command C2 corresponding to READ of column address 33 and row address 33 of in the bank 5 as an example, when the command C0 is executed, the finite state machine 1082 can first check if the row address 11 of the bank 0 is activated. if the row address 11 of the bank 0 is inactivated and another row of the bank 0 is activated, the finite state machine 1082 enters a pre-charge state and the pre-charge command generating circuit 1104 of the command processor 150 could generate the pre-charge command PRECH_K0 (at a time T1 shown in FIG. 9). If the bank 0 is in an idle mode and no row of the bank 0 is activated, the finite state machine 1082 enters an active state and the active command generating circuit 1102 of the command processor 150 generates the active command ACT_K0_R11 (at a time T9 shown in FIG. 9).

As shown in FIG. 9, unoccupied time exists between the pre-charge command PRECH_K0 and the active command ACT_K0_R11 of the command C0, and the pre-row address command generating circuit 1106 of the command processor 150 can generate the pre-row address command PRA0 together with row address 11 in the unoccupied time to DRAM. The row address 11 and the pre-row address command PRA0 could be simultaneously generated, or generated within the same clock period to DRAM. The pre-row address command PRA0 could be generated at a clock falling edge (at a time T2 shown in FIG. 9) right after the pre-charge command PRECH_K0 because the command C0 corresponds to the column address 11 and the row address 11 of the bank 0, when the pre-charge command generating circuit 1104 generates the pre-charge command PRECH_K0, next, the finite state machine 1082 knows that it will control the pre-row address command generating circuit 1106 to generate the pre-row address command PRA0). In another embodiment, the pre-row address command generating circuit 1106 can generate the pre-row address command PRA0 with row address 11 at a clock rising edge (at a time T3 shown in FIG. 9) right after the pre-charge command PRECH_K0. The clock falling edge and the clock rising edge correspond to an inner clock applied to the plurality of memories M1-Mm.

In addition, the present invention is not limited to the pre-row address command generating circuit 1106 generating the pre-row address command PRA0 at the clock falling edge or the clock rising edge right after the pre-charge command PRECH_K0. That is, any configuration in which the pre-row address command generating circuit 1106 generates the pre-row address command PRA0 between the pre-charge command PRECH_K0 and the active command ACT_K0_R11 (or during the period tRP) falls within the scope of the present invention.

In addition, because the command C0 corresponds to the column address 11 and the row address 11 of the bank 0, when the pre-charge command PRECH_K0 or the active command ACT_K0_R11 is generated, the finite state machine 1082 also knows the column address 11, and it could further control the pre-column address command generating circuit 1108 to generate the pre-column address command PCA0 with the column address 11 at suitable time. The column address 11 and the pre-column address command PCA0 could be simultaneously generated, or generated within the same clock period to DRAM. Therefore, can also generate the pre-column can also generate the pre-column address command PCA0 (not shown in FIG. 6) with column address 11 before the READ command RD_K0_C11 of the command C0, or between the active command ACT_K0_R11 and the READ command RD_K0_C11 of the command C0 (or between tRCD).

As shown in FIG. 9, after the pre-charge command generating circuit 1104 generates the pre-charge command PRECH_K0, next, the command C1 stored in the sequencing engine 108 could be looked ahead by the finite state machine 1082. The finite state machine 1082 can first check if the row address 22 of the bank 7 is activated. If the row address 22 of the bank 7 is inactivated and another row of the bank 7 is activated, the finite state machine 1082 enters the pre-charge state and controls the pre-charge command generating circuit 1104 to generate a pre-charge command PRECH_K7 (at a time T4 shown in FIG. 9). If the bank 7 is in an idle mode and no row of the bank 7 is activated, the finite state machine 1082 enters the active state and controls the active command generating circuit 1102 to generate an active command ACT_K7_R22 (at a time T10 shown in FIG. 9). Again, as shown in FIG. 9, unoccupied time exists between the pre-charge command PRECH_K7 and the active command ACT_K7_R22 of the command C1. Thus, a pre-row address command PRAT with row address 22 corresponding to the command C1 can be generated by the pre-row address command generating circuit 1106 at a clock falling edge (at a time T5 shown in FIG. 9) right after the pre-charge command PRECH_K7, or at a clock rising edge (at a time T6 shown in FIG. 9) right after the pre-charge command PRECH_K7.

As previously discussed, unlike the command C0 and C1, there is no pre-charge command corresponding to command C2 issued by the command processor 150, because the bank 5 to be read according command C2 may be pre-charged (or be executed by an auto-refresh command, or a pre-charge all command) before T1. Therefore, in this case, a pre-row address command PRA5 with row address 33 corresponding to the command C2 can be generated by the pre-row address command generating circuit 1106 at time T7 which is a clock rising edge, as shown in FIG. 9 (or at time T8 which is the a clock falling edge, as shown in FIG. 9) before the issuance of the active command ACT_K5_R33 of the command C2 at time T11. To be mentioned, tRRD (defined in JEDEC) shall be satisfied during the issuance of two different active commands. Moreover, the duration "tPRA2C" between issuing the pre-row address command and issuing the active command corresponding to the same command C0 (or C1, C2, etc.) shall not be less than one clock period of the inner clock applied to the plurality of memories M1-Mm.

Figure 10:
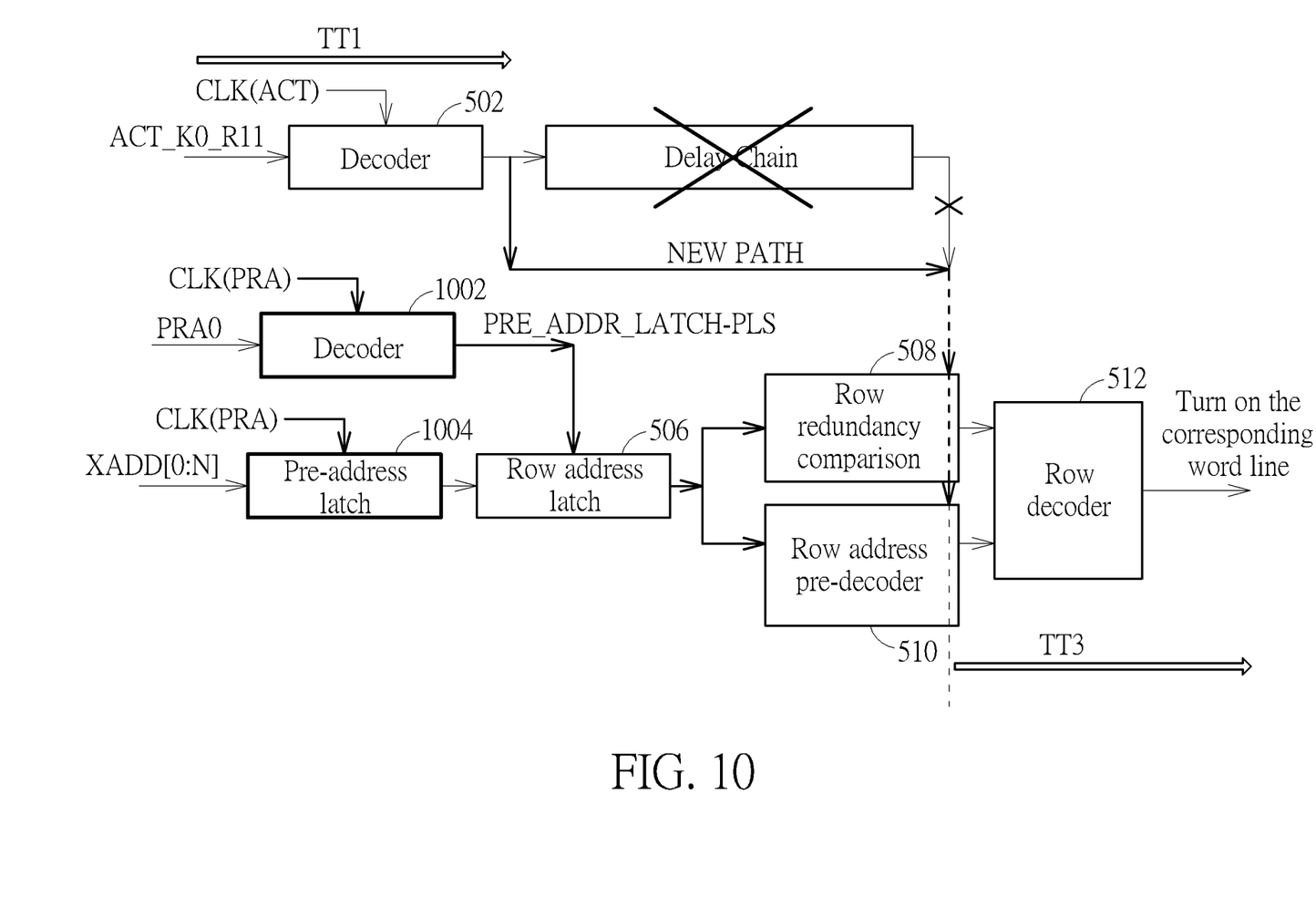
FIG. 10 is a diagram illustrating operation of the memory after the memory receives the active command.

In addition, as shown in FIG. 10, taking the command C0 as an example, after the pre-row address command PRA0 is generated, because a decoder 1002 of the memory M1 can decode the pre-row address command PRA0 to generate a precision lock signal PRE_ADDR_LATCH_PLS to the row address latch 506 of the memory M1, and a pre-address latch 1004 of the memory M1 latches an address of the bank 0, address 11, and an address of the column address 11, the row redundancy comparison 508 and the row address pre-decoder 510 can be ready before the active command ACT_K0_R11 is received by the memory M1, or before the active command ACT_K0_R11 is decoded by the decoder 502 of the memory M1.

As shown in FIG. 10, because the row redundancy comparison 508 and the row address pre-decoder 510 can be ready before the active command ACT_K0_R11 is received by (or decoded by the decoder 502 of) the memory M1, a delay chain in FIG. 5 could be reduced in FIG. 10, wherein the delay chain is used to wait for the row address latch 506 latching the address of the row address 11, and the row redundancy comparison 508 and the row address pre-decoder 510 being ready. That is, the time interval TT2 in FIG. 5 does not exist in this FIG. 10.

Furthermore, in another embodiment, in the unoccupied time exists between the pre-charge command PRECH_K0 and the active command ACT_K0_R11 of the command C0, the command processor 150 just issues row address 11 (without the pre-row address command) to DRAM. For example, the row address 11 could be generated at a clock falling edge (at a time T2 shown in FIG. 9) right after the pre-charge command PRECH_K0, or the row address 11 could be generated at a clock rising edge (at a time T3 shown in FIG. 9) right after the pre-charge command PRECH_K0.

Of course, in this situation the decoder 1002 of the memory in FIG. 10 will be modified and can decode the pre-charge command (because in this situation there is no pre-row address command) or other available command (or address bits combination) to generate a precision lock signal to the row address latch 506 of the memory M1.

Moreover, in the unoccupied time exists between the active command ACT_K0_R11 and the READ command RD_K0_C11 of the command C0, the command processor 150 just issues column address 11 (without the pre-column address command) to DRAM. For example, the column address 11 could be generated at a clock falling edge right after the active command ACT_K0_R11, or the row address 11 could be generated at a clock rising edge right after the active command ACT_K0_R11.

Figure 11:
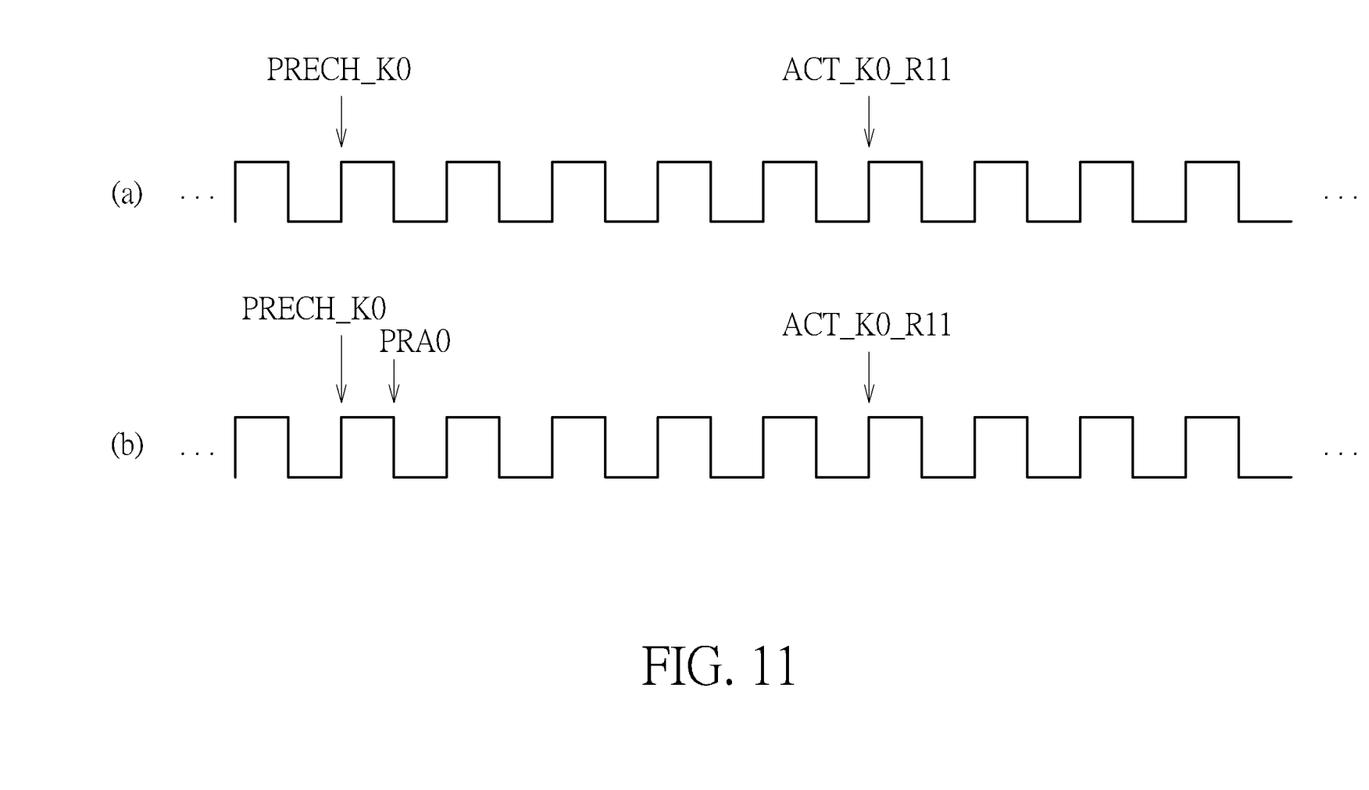
FIGS. 11, 12 are timing diagrams illustrating operation of the memory based on the pre-row address command and operation of the memory based on the prior art.
Figure 12:
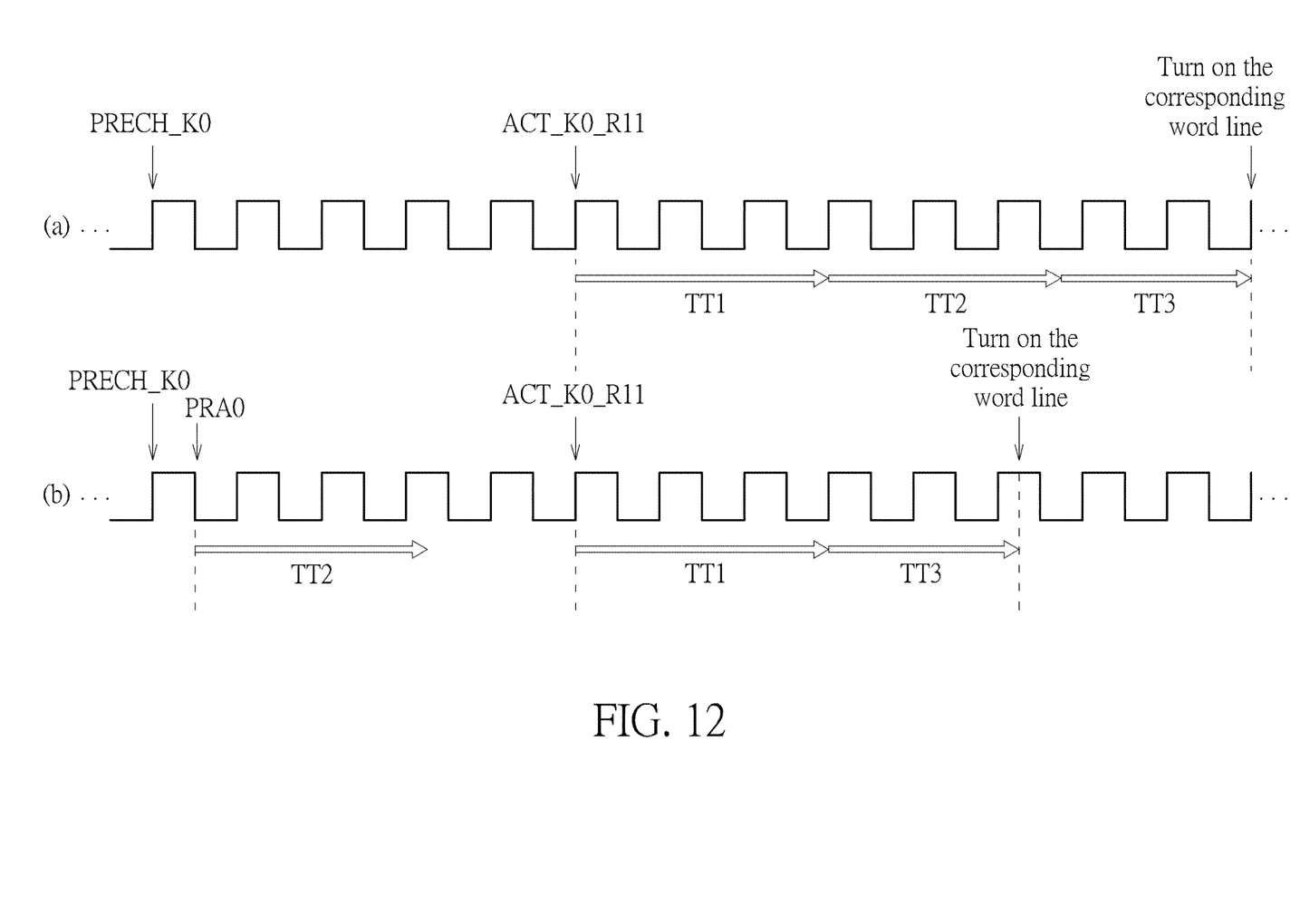

Please refer to FIGS. 11, 12. FIGS. 11, 12 are timing diagrams illustrating operation of the memory M1 based on the pre-row address command PRA0 and operation of the memory M1 based on the prior art. As shown in FIG. 11 (a), after the memory M1 receives the pre-charge command PRECH_K0, if the pre-row address command PRA0 is not applied to the memory M1 (that is, the prior art), the memory M1 does not latch the row address data RAD corresponding to the address of the row address 11), not pre-decode the row address data RAD, and not execute row redundancy comparison 508 until the memory M1 receives the active command ACT_K0_R11 even if the command C0 has included the row address data RAD. That is, the memory M1 does not start to latch the row address data RAD, pre-decode the row address data RAD, 08 until the memory M1 receives the active command ACT_K0_R11. Therefore, when the memory M1 receives the active command ACT_K0_R11, the memory M1 starts to decode the active command ACT_K0_R11; then the memory M1 latches the row address data RAD, pre-decodes the row address data RAD, the row redundancy comparison 508; and then the memory M1 decodes a corresponding word line according to the row address data RAD to turn on the corresponding word line, wherein to latch the row address data RAD, pre-decode the row address data RAD, 08 is the prior art to one of ordinary skill in the art, so further description thereof is omitted for simplicity.

However, as shown in FIG. 11 (b), after the memory M1 receives the pre-charge command PRECH_K0, if the pre-row address command PRA0 is applied to the memory M1, the memory M1 can decode the pre-row address command PRA0 to obtain the row address data RAD, latch the row address data RAD, pre-decode the row address data RAD, and execute the row redundancy comparison 508 before the memory M1. Because the memory M1 has decoded the pre-charge command PRECH_K0, latched the row address data RAD, pre-decoded the row address data RAD, and executed the row redundancy comparison 508 before the active command ACT_K0_R11 is decoded, when the memory M1 receives the active command ACT_K0_R11, the memory M1 can quickly turn on the corresponding word line according to the row address 11.

In addition, as shown in FIG. 12(a), after the memory M1 receives the pre-charge command PRECH_K0, if the pre-row address command PRA0 is not applied to the memory M1 (that is, the prior art), after the memory M1 receives the active command ACT_K0_R11, time intervals TT1-TT3 need to exist before the memory M1 turns on the corresponding word line according to the row address data RAD, wherein the time interval TT1 is for the memory M1 receiving the active command ACT_K0_R11 and decoding the active command ACT_K0_R11, the time interval TT2 is for the memory M1 latching the row address data RAD, pre-decoding the row address data RAD, and executing the row redundancy comparison 508, and the time interval TT3 is for the memory M1 decoding the corresponding word line according to the row address data RAD to turn on the corresponding word line.

However, as shown in FIG. 12(b), after the memory M1 receives the pre-charge command PRECH_K0, if the pre-row address command PRA0 is applied to the memory M1, because the memory M1 has decoded the pre-row address command PRA0 to obtain the row address data RAD, latched the row address data RAD, pre-decoded the row address data RAD, and executed the row redundancy comparison 508 before the memory M1, only the time intervals TT1, TT3 exist before the memory M1 turns on the corresponding word line after the memory M1 receives the active command ACT_K0_R11. That is, when the memory M1 receives the active command ACT_K0_R11, the memory M1 can quickly turn on the corresponding word line according to the row address 11.

In addition, the arbitration circuit 104, the sequencing engine 108, and the command processor 150 can be field programmable gate arrays (FPGAs) with the above-mentioned functions of the arbitration circuit 104, the sequencing engine 108, and the command processor 150, or application-specific integrated circuits (ASICs) with the above-mentioned functions of the arbitration circuit 104, the sequencing engine 108, and the command processor 150, or a software module with the above-mentioned functions of the arbitration circuit 104, the sequencing engine 108, and the command processor 150, or analog integrated circuits with the above-mentioned functions of the arbitration circuit 104, the sequencing engine 108, and the command processor 150.

In addition, because one of ordinary skill in the art can input codes of the above-mentioned functions of the arbitration circuit 104, the sequencing engine 108, and the command processor 150 to the field programmable gate arrays (FPGAs), or utilize intellectual property cores (IPs) of the above-mentioned functions of the arbitration circuit 104, the sequencing engine 108, and the command processor 150 to implement the application-specific integrated circuits (ASICs) with the above-mentioned functions of the arbitration circuit 104, the sequencing engine 108, and the command processor 110, and the field programmable gate arrays (FPGAs) and the intellectual property cores (IPs) are obviously ready-made to one of ordinary skill in the art, structures of the arbitration circuit 104, the sequencing engine 108, and the command processor 110 are not necessary to disclose.

To sum up, because the unoccupied time exists between the pre-charge command and the active command, the present invention can utilize the pre-row address command generating circuit of the command processor to generate the pre-row address command between the pre-charge command and the active command to the memory, so that compared to the prior art, the memory can utilize the pre-row address command to reduce a time interval between the memory receiving the active command and turning on the corresponding word line.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A memory controller for a memory, comprising:
   a command processor;
   wherein when an access command is performed by the memory controller, the command processor generates a row address information to the memory after issuing a pre-charge command and before issuing an active command to the memory;
   wherein the row address information and the active command are issued by the command processor based on the access command.

2. The memory controller of claim 1, wherein the command processor further issues the pre-charge command to the memory, and the row address information is generated at a clock falling edge or a clock rising edge right after the pre-charge command.

3. The memory controller of claim 1, wherein the command processor further issues a pre-row address command to the memory to latch the row address information before the memory receives the active command, and the pre-row address command is issued by the command processor based on the access command.

4. The memory controller of claim 3, wherein the row address information and the pre-row address command are generated to the memory within a clock period, or simultaneously generated to the memory.

5. The memory controller of claim 1, wherein after issuing the active command, the command processor generates a read or write command based on the access command, and the command processor further generates a column address information between issuing the active command and issuing the read or write command.

6. The memory controller of claim 5, wherein the command processor further issues a pre-column address command to the memory to latch the column address information before the memory receives the read or write command, and the pre-column address command is issued by the command processor based on the access command.

7. The memory controller of claim 6, wherein the column address information and the pre-column address command are generated to the memory within a clock period, or simultaneously generated to the memory.

8. The memory controller of claim 1, further comprising:
   a sequencing engine coupled to the command processor, wherein the access command is stored in the sequencing engine, and the sequencing engine controls the command processor to sequentially generate the row address information and the active command according to the access command.

9. The memory controller of claim 8, wherein after issuing the active command, the sequencing engine controls the command processor to generate a column address information corresponding to the access command, and then generate a read or write command corresponding to the access command.

10. A memory configured to receive an access command from a memory controller, the memory comprising:
    a first decoder configured to decode an active command corresponding to the access command;
    wherein a row address information corresponding to the access command is received by the memory after a pre-charge command being received by the memory and before the active command being received by the memory.

11. The memory of claim 10, further comprising a second decoder configured to decode the pre-charge command corresponding to the access command; wherein the row address information is received by the memory at a clock falling edge or a clock rising edge right after the pre-charge command is received by the memory.

12. The memory of claim 10, further comprising:
    a third decoder configured to decode a pre-row address command corresponding to the access command;
    wherein the pre-row address command is configured to latch the row address information before the memory receives the active command.

13. The memory of claim 12, wherein the row address information and the pre-row address command are received by the memory within a clock period, or simultaneously received by the memory.

14. The memory of claim 12, further comprising a row address latch, wherein the third decoder decodes the pre-row address command and generates a latch signal to the row address latch to latch the row address information before the memory receives the active command.

15. The memory of claim 10, further comprising:
    a fourth decoder configured to decode a read or write command corresponding to the access command;
    wherein a column address information is received by the memory before the read or write command is received by the memory.

16. The memory of claim 15, wherein the column address information and a pre-column address command are received by the memory within a clock period, or simultaneously received by the memory.

17. The memory of claim 15, further comprising:
a fifth decoder configured to decode a pre-column address command corresponding to the access command;
wherein the pre-column address command is configured to latch the column address information before the memory receives the read or write command.

18. The memory of claim 17, wherein the column address information and the pre-column address command are received by the memory within a clock period, or simultaneously received by the memory.

19. The memory of claim 17, further comprising a column address latch, wherein the fifth decoder decodes the pre-column address command and generates a latch signal to the column address latch to latch the column address information before the memory receives the read or write command.

20. A memory system, comprising:
a memory controller; and
a memory coupled to the memory controller;
wherein when an access command is performed by the memory controller, a command processor comprised in the memory controller generates a row address information to the memory after issuing a pre-charge command and before issuing an active command to the memory;
wherein the row address information and the active command are issued by the command processor based on the access command.

21. The memory system of claim 20, wherein the command processor further issues a pre-row address command to the memory to latch the row address information before the memory receives the active command.

22. The memory system of claim 21, wherein the row address information and the pre-row address command are generated to the memory within a clock period, or simultaneously generated to the memory.

* * * * *